United States Patent
Leobandung

(10) Patent No.: US 10,629,601 B2
(45) Date of Patent: Apr. 21, 2020

(54) TRANSISTOR AND CAPACITOR STRUCTURES FOR ANALOG MEMORY NEURAL NETWORK

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/032,770

(22) Filed: Jul. 11, 2018

(65) Prior Publication Data

US 2020/0020695 A1  Jan. 16, 2020

(51) Int. Cl.
| | | |
|---|---|---|
| H01L 27/10 | (2006.01) | |
| H01L 27/108 | (2006.01) | |
| G06N 3/063 | (2006.01) | |
| H01L 29/66 | (2006.01) | |
| H01L 29/786 | (2006.01) | |
| H01L 27/11524 | (2017.01) | |

(52) U.S. Cl.
CPC ..... *H01L 27/10876* (2013.01); *G06N 3/0635* (2013.01); *H01L 27/1085* (2013.01); *H01L 27/10823* (2013.01); *H01L 29/66545* (2013.01); *H01L 27/108* (2013.01); *H01L 27/10844* (2013.01); *H01L 27/11524* (2013.01); *H01L 29/78696* (2013.01)

(58) Field of Classification Search
CPC ............. H01L 29/78696; H01L 27/108; H01L 27/1084; H01L 27/10823; H01L 27/11524
See application file for complete search history.

(56) References Cited

U.S. PATENT DOCUMENTS

| 5,795,804 A | 8/1998 | Jenq |
| 5,821,139 A | 10/1998 | Tseng |
| 6,130,127 A | 10/2000 | Yang |
| 6,165,864 A | 12/2000 | Shen et al. |
| 6,362,041 B1 | 3/2002 | Wang et al. |

(Continued)

FOREIGN PATENT DOCUMENTS

EP  0997933 A1  5/2000

OTHER PUBLICATIONS

S.H. Dhong et al., "Stacked Capacitor DRAM Cell With Vertical Fins (VF-STC)," IP.com No. IPCOM000101238D, Jul. 1, 1990, pp. 245-247.

*Primary Examiner* — Nicholas J Tobergte
(74) *Attorney, Agent, or Firm* — Vazken Alexanian; Ryan, Mason & Lewis, LLP

(57) ABSTRACT

A method for manufacturing a semiconductor device includes forming a plurality of transistors on a semiconductor substrate. The formation of the plurality of transistors includes recessing channels of at least two transistors of the plurality of transistors. In the method, a stacked capacitor is formed on the semiconductor substrate, and the stacked capacitor is electrically connected in parallel to the at least two transistors of the plurality of transistors comprising the recessed channels and to an additional one of the plurality of transistors. The stacked capacitor, the at least two transistors and the additional one of the plurality of transistors form a memory cell of a plurality of memory cells of a memory device.

11 Claims, 12 Drawing Sheets

(56) References Cited

U.S. PATENT DOCUMENTS

| | | | |
|---|---|---|---|
| 6,642,563 B2* | 11/2003 | Kanaya | H01L 21/76801 |
| | | | 257/296 |
| 6,709,919 B2 | 3/2004 | Tu | |
| 7,235,838 B2 | 6/2007 | Lin et al. | |
| 7,274,060 B2* | 9/2007 | Popp | H01L 21/26586 |
| | | | 257/296 |
| 8,134,823 B2 | 3/2012 | Chen et al. | |
| 8,503,216 B2* | 8/2013 | Kajiyama | H01L 27/228 |
| | | | 365/148 |
| 8,766,343 B2 | 7/2014 | Kang et al. | |
| 9,117,749 B1* | 8/2015 | Or-Bach | H01L 27/2436 |
| 2002/0053694 A1* | 5/2002 | Sutcliffe | G11C 29/40 |
| | | | 257/326 |
| 2003/0227041 A1* | 12/2003 | Atwood | G11C 11/405 |
| | | | 257/296 |
| 2009/0257169 A1 | 10/2009 | Chen et al. | |
| 2010/0127325 A1* | 5/2010 | Lim | H01L 21/26586 |
| | | | 257/334 |
| 2012/0129301 A1* | 5/2012 | Or-Bach | H01L 21/6835 |
| | | | 438/129 |

* cited by examiner

US 10,629,601 B2

TRANSISTOR AND CAPACITOR STRUCTURES FOR ANALOG MEMORY NEURAL NETWORK

TECHNICAL FIELD

The field generally relates to semiconductor devices and methods of manufacturing same and, in particular, to a transistor and capacitor structure for a memory cell.

BACKGROUND

Dynamic random-access memory (DRAM) devices utilize capacitors to store bits of data in an integrated circuit. In a conventional DRAM memory cell, a metal-oxide-semiconductor field-effect transistor (MOSFET) functions as a control switch and a capacitor stores charges corresponding to data that is to be stored. A capacitor, for example, can be charged or discharged, representing two values of a bit, conventionally referred to as 0 and 1. Capacitance increases with the surface area of the capacitor and high capacitance prevents loss of stored data. The way to increase the charge-storing capacity of a capacitor is to increase the dielectric coefficient of the dielectric material and reduce the thickness of the dielectric material, plus increasing the surface area of the capacitor.

Planar type capacitors undesirably occupy a large area of a semiconductor substrate and are not suited for high or large-scale integration. Highly-integrated DRAM devices may employ stacked capacitors, which occupy less area of the semiconductor substrate, while also allowing for increases in surface area and corresponding capacitance of the capacitor.

Memory devices can be stacked in a three-dimensional (3D) configuration in a stackable cross-gridded data access array, referred to as a crossbar array. Crossbar configurations have been applied to devices implementing neural networks.

There is a need for memory devices and structures utilizing stacked capacitors in connection with a crossbar neural network.

SUMMARY

According to an exemplary embodiment of the present invention, a method for manufacturing a semiconductor device includes forming a plurality of transistors on a semiconductor substrate. The formation of the plurality of transistors includes recessing channels of at least two transistors of the plurality of transistors. In the method, a stacked capacitor is formed on the semiconductor substrate, and the stacked capacitor is electrically connected in parallel to the at least two transistors of the plurality of transistors comprising the recessed channels and to an additional one of the plurality of transistors. The stacked capacitor, the at least two transistors and the additional one of the plurality of transistors form a memory cell of a plurality of memory cells of a memory device.

According to an exemplary embodiment of the present invention, a semiconductor device includes a plurality of memory cells. Each memory cell includes first and second transistors each comprising a recessed channel disposed on a semiconductor substrate, and a third transistor disposed on the semiconductor substrate. A stacked capacitor is also disposed on the semiconductor substrate. The stacked capacitor is electrically connected in parallel to the first, second and third transistors, where the transistors include at least one NFET and at least one PFET.

According to an exemplary embodiment of the present invention, a method for manufacturing a semiconductor device includes forming first, second and third transistors on a semiconductor substrate. The first, second and third transistors respectively include first, second and third channels. In the method, the first and second channels of the first and second transistors are recessed, and a stacked capacitor is formed on the semiconductor substrate. The stacked capacitor is electrically connected in parallel to the first, second and third transistors. The first, second and third transistors and the stacked capacitor form a memory cell of a plurality of memory cells of a memory device.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1B:
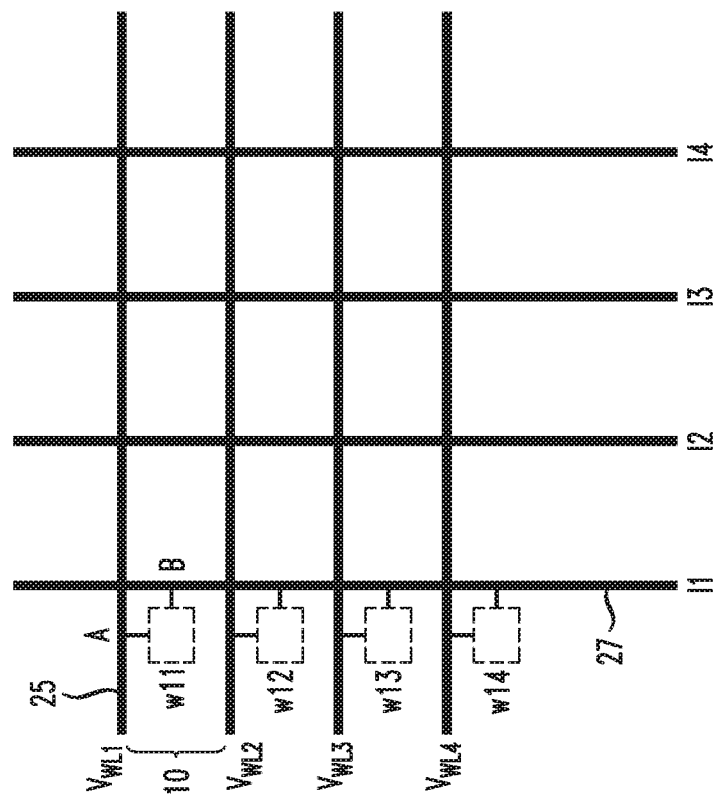
FIG. 1B is a block diagram illustrating an array of memory cells, according to an exemplary embodiment of the present invention.

Exemplary embodiments of the invention will now be discussed in further detail with regard to semiconductor devices and methods of manufacturing same and, in particular, to NFET and PFET transistors having recessed and non-recessed channels, and connected in parallel to a stacked capacitor in a memory cell of an array.

It is to be understood that the various layers and/or regions shown in the accompanying drawings are not drawn to scale, and that one or more layers and/or regions of a type commonly used in, for example, random-access memory (RAM), dynamic random-access memory (DRAM), field-effect transistor (FET), metal-oxide-semiconductor field-effect transistor (MOSFET), fin field-effect transistor (FinFET), vertical field-effect transistor (VFET), complementary metal oxide semiconductor (CMOS), nanowire FET, nanosheet FET, single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, RAMs, DRAMs, FETs, MOSFETs, FinFETs, VFETs, CMOSs, nanowire FETs, nanosheet FETs, and/or SETs. By way of non-limiting example, the semiconductor devices can include, but are not necessarily limited to RAM, DRAM, FET, MOSFET, FinFET, VFET, CMOS, nanowire FET, nanosheet FET, and/or SET devices, and/or semiconductor devices that use RAM, DRAM, FET, MOSFET, FinFET, VFET, CMOS, nanowire FET, nanosheet FET, and/or SET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

In accordance with embodiments of the present invention stacked capacitors are used to store analog information for a crossbar neural network. A memory device has a compact layout of a memory cell including a parallel connected stacked capacitor utilized as a storage element, a read out transistor, and respective transistors providing current sources for charging and discharging the memory cell. In order to achieve low current leakage from the capacitor, the two transistors for both current sources have recessed channels resulting in longer gate lengths and the read out transistor also have a recessed channel. Alternatively, the read out transistor does not include a recessed channel.

According to an embodiment of the present invention, a stacked DRAM capacitor is built on top of three or more FETs, where the FETs include recessed channels and non-recessed channels. The FETs are n-type and p-type FETs (NFETs and PFETs), and the stacked capacitor is connected in parallel to the transistors.

Figure 1A:
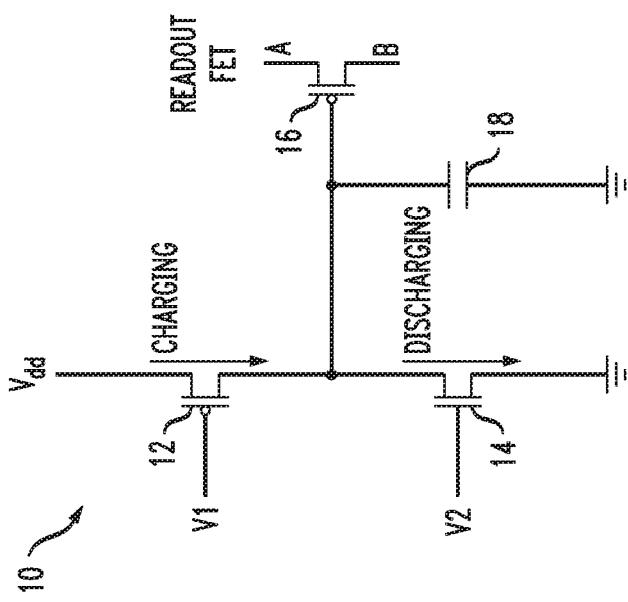
FIG. 1A is a circuit diagram illustrating a memory cell, according to an exemplary embodiment of the present invention.

FIG. 1A is a circuit diagram illustrating a memory cell, and FIG. 1B is a block diagram illustrating an array of memory cells, according to an exemplary embodiment of the present invention. Referring to FIG. 1A, a memory cell 10 includes a parallel connected stacked capacitor 18 utilized as a storage element, a read out transistor 16, and respective transistors 12 and 14 providing current sources for charging and discharging the memory cell. In order to achieve low current leakage, the two transistors 12 and 14 for both current sources have recessed channels and the read out transistor 16 does not have a recessed channel. The charging transistor 12 is connected to a first gate voltage V1 and the discharging transistor 14 is connected to a second gate voltage V2. Other logic peripheral circuits generate the appropriate level and duration of voltage for V1 and V2 to control the amount of charge and discharge.

Referring to FIG. 1B, an array 20 of memory cells 10 is formed, for example, in a crossbar configuration for a neural network. The array 20 includes wordlines 25 in the horizontal direction corresponding to voltages $V_{WL1}$, $V_{WL2}$, $V_{WL3}$ and $V_{WL4}$, and bitlines 27 in the vertical direction corresponding to currents I1, I2, I3 and I4. Each memory cell 10 produces a controllable impedance w (e.g., w11, w12, w13 and w14) which is controlled by the outputs of charging and discharging transistors 12 and 14. Source/drain outputs of readout transistor 16 are labeled A and B in FIGS. 1A and 1B. A current (I) of a bitline is the sum of the respective products of a wordline voltage of each memory cell 10 and a corresponding controllable impedance produced by the memory cell 10. For example, the current $I_1 = V_{WL1}*w11 + V_{WL2}*w12 + V_{WL3}*w13 + V_{WL4}*w14$.

Figure 2A:
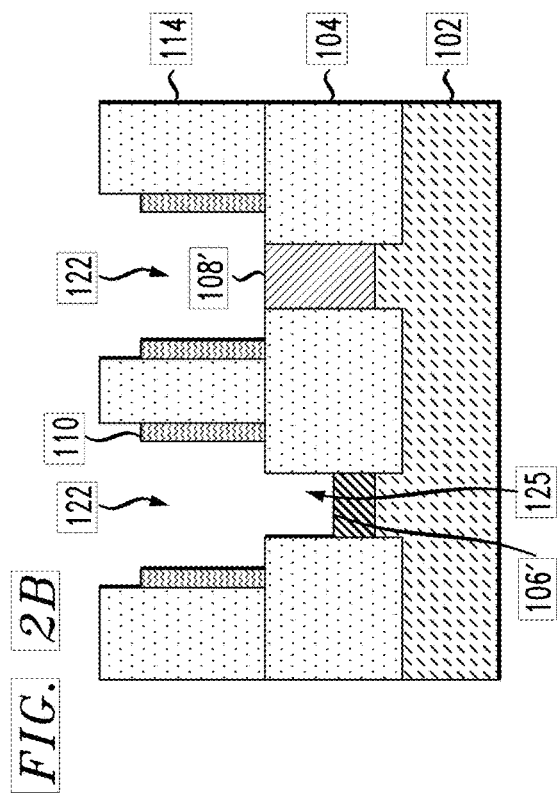
FIG. 2A is a cross-sectional view taken along the line A in FIG. 2D illustrating channel recessing in a method of manufacturing a semiconductor device, according to an exemplary embodiment of the present invention.
Figure 2B:
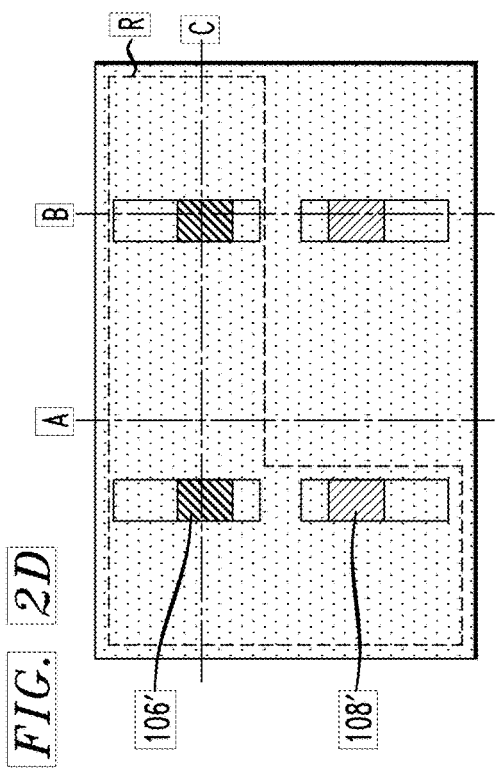
FIG. 2B is a cross-sectional view taken along the line B in FIG. 2D illustrating channel recessing in a method of manufacturing a semiconductor device, according to an exemplary embodiment of the present invention.
Figure 2C:
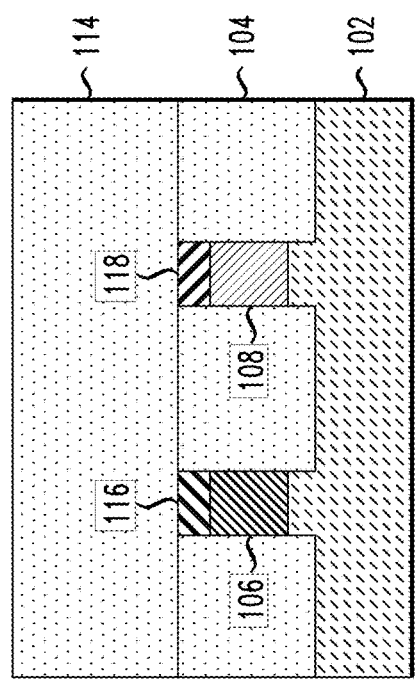
FIG. 2C is a cross-sectional view taken along the line C in FIG. 2D illustrating channel recessing in a method of manufacturing a semiconductor device, according to an exemplary embodiment of the present invention.
Figure 2D:
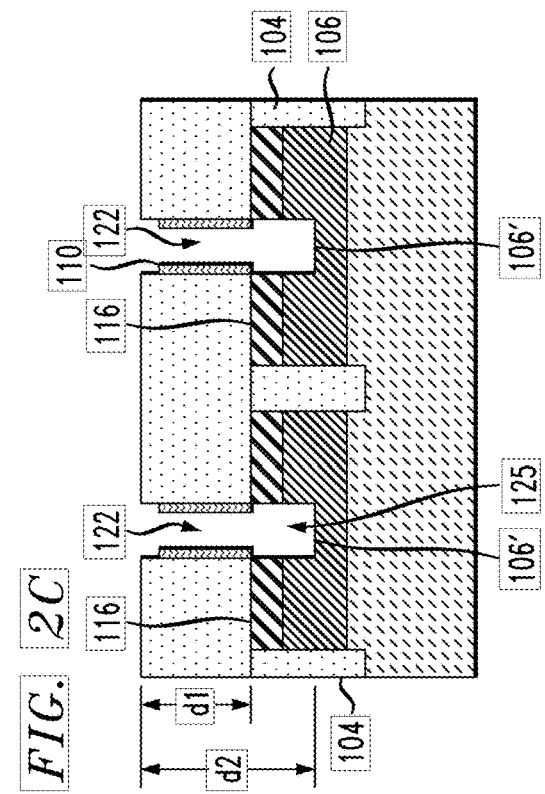
FIG. 2D is a top down view illustrating channel recessing in a method of manufacturing a semiconductor device, according to an exemplary embodiment of the present invention.

FIGS. 2A, 2B and 2C are cross-sectional views taken along the lines A, B and C, respectively of the top view in FIG. 2D illustrating channel recessing in a method of manufacturing a semiconductor device, according to an exemplary embodiment of the present invention. Referring to FIGS. 2A-2D, a semiconductor substrate 102 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), II-V compound semiconductor or other like semiconductor. In addition, multiple layers of the semiconductor materials can be used as the semiconductor material of the substrate. The semiconductor substrate 102 can be a bulk substrate.

Trenches are formed in the substrate 102, by for example, a wet or dry etch process to form isolation regions, such as shallow trench isolation (STI) regions. A dielectric material layer 104 including, but not necessarily limited to silicon oxide (SiOx), where x is, for example, 2 in the case of silicon dioxide (SiO$_2$), or 1.99 or 2.01, low-temperature oxide (LTO), high-temperature oxide (HTO), flowable oxide (FOX), silicon oxycarbide (SiOC), silicon oxycarbonitride (SiOCN) or some other dielectric, is formed in the trenches to define the isolation regions.

Four transistor well regions 106 and 108 are formed, including 2 PFET transistor well regions 106, and two NFET transistor well regions 108. Three of the four resulting transistors may be used for a memory cell 10 (e.g., 2 PFETs and one NFET). Alternatively, 2 NFETs and one PFET can be used. A remaining one of the four resulting transistors can be used for other circuits. While four transistor well regions 106 and 108 are described, it is to be understood that the embodiments of the present invention are not limited thereto, and more than four transistors can be used on the substrate 102. Although embodiments of the present invention are described in connection with planar transistors, the embodiments of the present invention are not necessarily limited thereto, and may apply to other types of transistors, such as, for example, FinFETs and nanowire FETs.

N-type wells and p-type wells are respectively implanted for the PFET transistor well regions 106 and the NFET transistor well regions 108. The wells are implanted using, for example, block masks covering the regions not being implanted. Dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations.

Dummy gate structures including a dummy gate layer (not shown because FIGS. 2A-2D illustrate structures after dummy gate layer removal) surrounded by spacer layers 110, are formed on the transistor well regions 106 and 108 after well implantation. The material of the dummy gate layers includes, but is not necessarily limited to, amorphous silicon, and the material of the spacer layers 110 includes, but is not necessarily limited to, silicon boron nitride (SiBN), siliconborocarbonitride (SiBCN), silicon oxycarbonitride (SiOCN), SiN or SiOx.

Source/drain regions 116 and 118 are formed on portions of the transistor well regions 106 and 108. Prior to removal of the dummy gate layers, p-type source/drain regions 116 are formed on exposed portions of the PFET transistor well regions 106 on either side of the dummy gate structures and n-type source/drain regions 118 are formed on exposed portions of the NFET transistor well regions 108 on either side of the dummy gate structures. The source/drain regions 116 and 118 are formed by, for example, dopant implantation or in-situ doping during epitaxial growth of the source/drain regions. As noted above, dopants may include, for example, an n-type dopant selected from a group of P, As and antimony Sb, and a p-type dopant selected from a group of B, Ga, In, and Tl at various concentrations. For example, in a non-limiting example, a dopant concentration range may be $1 \times 10^{18}/cm^3$ to $1 \times 10^{21}/cm^3$.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

A dielectric layer 114 is deposited on the source/drain regions 116 and 118, on exposed portions of the dielectric layer 104, and on and around the dummy gate structures including the dummy gate layers and the spacer layers 110. The dielectric layer 114 includes the same or similar materials as the dielectric layer 104, can be deposited using, for example, deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. Following deposition of the dielectric layer 114, excess portions of the dielectric layer 114 are removed by a planarization process, such as, for example, chemical mechanical polishing (CMP), which planarizes the dielectric layer 114 down to the spacer layers 110.

The dummy gate layers are removed to provide openings 122 (depth d1) between the spacers 110 exposing channel portions 106' and 108' between the source/drain regions 116, 118. A gate structure will be formed in the openings 122. The dummy gate layers can be removed using a selective etch process that selectively removes the dummy gate layers with respect to the dielectric layer 114 and spacers 110. The etch can be, for example, an isotropic etch, such as a wet chemical etch, or an anisotropic etch, such as reactive ion etching (RIE), ion beam etching, plasma etching or laser ablation. Prior to removal of the dummy gate layers, top portions of the spacer layers 110 are removed to expose the dummy gate layers.

After removal of the dummy gate layers to form the openings 122, some of the exposed channel portions 106' and 108' are recessed to result in deeper openings 125 (depth d2) than the openings 122 in which the gate structures will be formed. The deeper openings 125 will result in transistors having longer gate lengths, which results in less current leakage from a corresponding capacitor in a memory cell. As can be seen in FIGS. 2B and 2C, upper surfaces of the recessed channel regions 106' or 108' are recessed to heights below lower surfaces of the source/drain regions 116 and 118, whereas the non-recessed channel region 108' has an upper surface which is coplanar or substantially coplanar with the upper surface of the source/drain regions 118.

As noted above, in accordance with an embodiment of the present invention, the two transistors for both charging and discharging current sources have recessed channels, while the read out transistor does not have a recessed channel. Referring to FIGS. 2B, 2C and 2D, the channel portions 106' and 108' are recessed for three of the four transistors. For example, as noted by the outline R, the channel portions 106' corresponding to the two PFET transistors, and a channel portion 108' corresponding to one of the NFET transistors are recessed, while a channel portion 108' of a remaining one of the NFET transistors is not recessed. Any combination of the channel portions may be recessed depending on the design of a chip and locations of the transistors for both charging and discharging current sources. Based on the configuration in FIG. 2D, the top 2 PFETs (recessed) and the lower left NFET (also recessed) correspond to a memory cell, while the lower right (non-recessed) NFET is not used in the memory cell. However, the embodiments of the present invention are not necessarily limited thereto. For example, in an embodiment one of the transistors corresponding to a read-out transistor is not recessed.

Recessing of the channel portions 106' and 108' is performed using, for example, chlorine, flourine, or bromine based ME, and the depth of the recessed portion is about 0.1 µm to about 0.3 µm, resulting in an overall gate length for transistors with a recessed channel of about 0.2 µm to about 0.6 µm, and an overall gate length for transistors without a recessed channel of about 0.02 µm to about 0.1 µm.

Figure 3A:
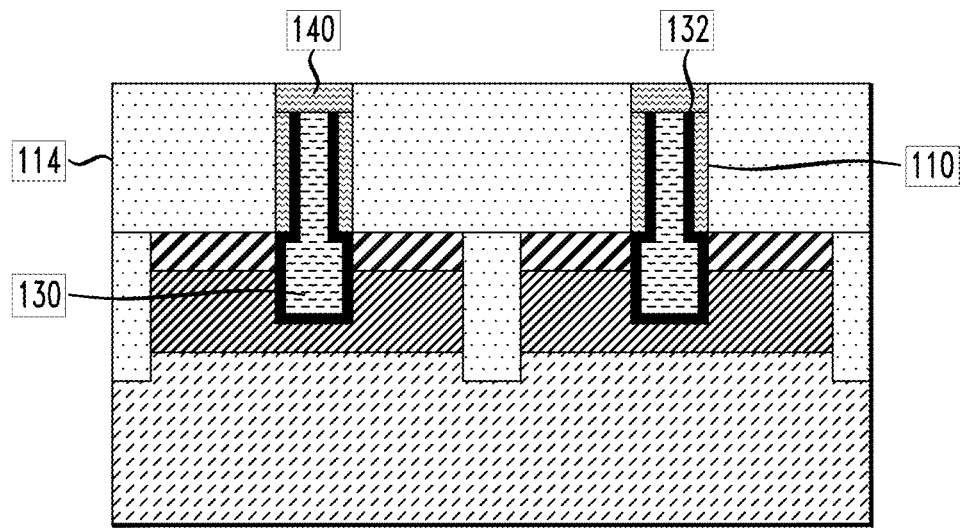
FIG. 3A is a cross-sectional view illustrating gate structure and hardmask formation in a method of manufacturing a semiconductor device, according to an exemplary embodiment of the present invention.
Figure 3B:
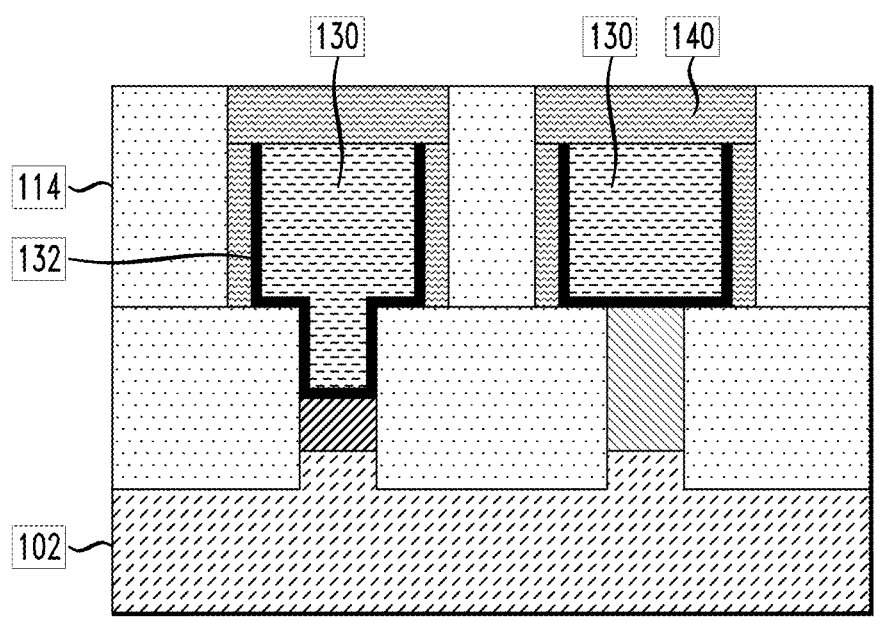
FIG. 3B is a cross-sectional view illustrating gate structure and hardmask formation in a method of manufacturing a semiconductor device, according to an exemplary embodiment of the present invention.

FIGS. 3A and 3B are cross-sectional views illustrating gate structure and hardmask formation in a method of manufacturing a semiconductor device, according to an exemplary embodiment of the present invention. The cross-sectional views in FIGS. 3A and 3B are taken along lines of a top view (not shown) corresponding to FIGS. 3A and 3B, and corresponding in location to the lines C and B, respectively, of FIG. 2D.

Referring to FIGS. 3A and 3B, gate structures are formed in the openings 122 and 125 left after removal of the dummy gate structures and the recessing of the selected channel portions. The gate structures are formed on the channel portions 106' and 108' of the transistors. Each gate structure includes, for example, a high-K dielectric layer 132 lining a bottom and lateral sides of the openings 122, 125. The high-K dielectric layer 132 includes, but is not necessarily limited to, $HfO_x$ (hafnium oxide (e.g., $HfO_2$)), $ZrO_2$ (zirconium dioxide), hafnium zirconium oxide, $Al_2O_3$ (aluminum oxide), and $Ta_2O_5$ (tantalum V oxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

A gate metal layer 130 is formed in each of the openings 122, 125 on the high-k dielectric layer 132. In accordance with an embodiment of the present invention, the gate metal layer 130 includes a work function metal (WFM) comprising, for example, titanium nitride (TiN), tantalum nitride (TaN), ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or TaN, and at least one other metal layer deposited on the WFM layer. The other metal layer may include, but is not necessarily limited to, a low resistance metal, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof. The gate metal layer 130 later functions as a gate electrode.

The gate metal and high-k dielectric layers 130, 132 can be deposited using one or more deposition techniques including, but not limited to, CVD, PECVD, RFCVD, PVD, ALD, MBD, PLD, and/or LSMCD, sputtering, and/or plating, followed by deposition of a hardmask layer 140 on each of the gate structures including the gate metal and high-k dielectric layers 130, 132. The material of the hardmask layers 140 can be the same or similar to the material of the spacers 110, and can be deposited by one of the noted deposition techniques, followed by planarization down to the dielectric layer 114, using, for example, CMP. The spacers 110 are located on the gate structure, each having an edge located on a vertical sidewall of the gate structure including the high-k dielectric layer 132.

Figure 4A:
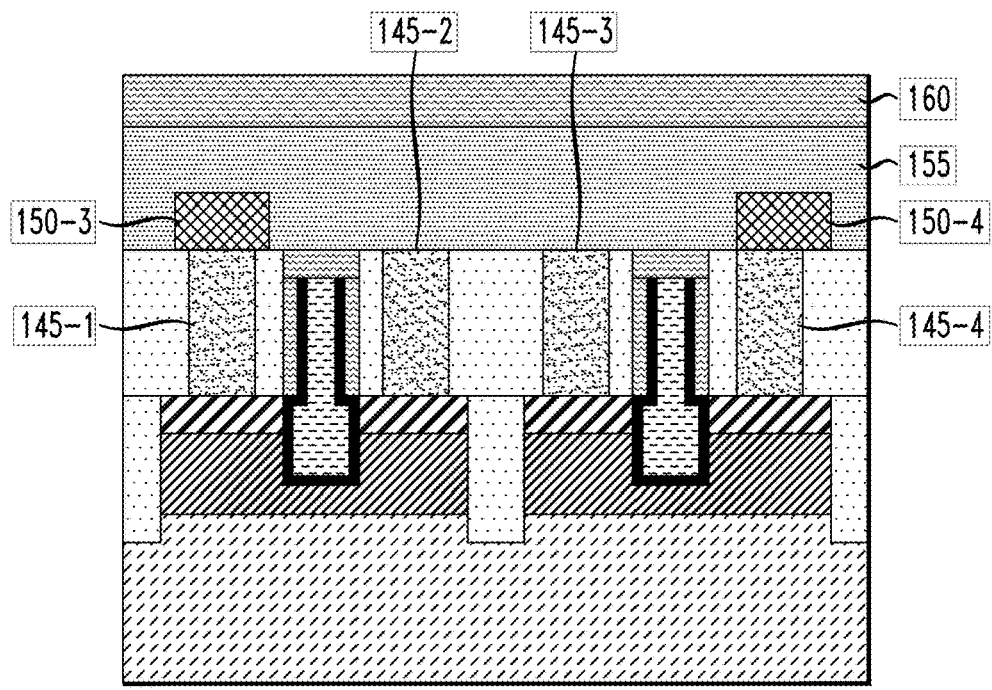
FIG. 4A is a cross-sectional view illustrating metallization in a method of manufacturing a semiconductor device, according to an exemplary embodiment of the present invention.
Figure 4B:
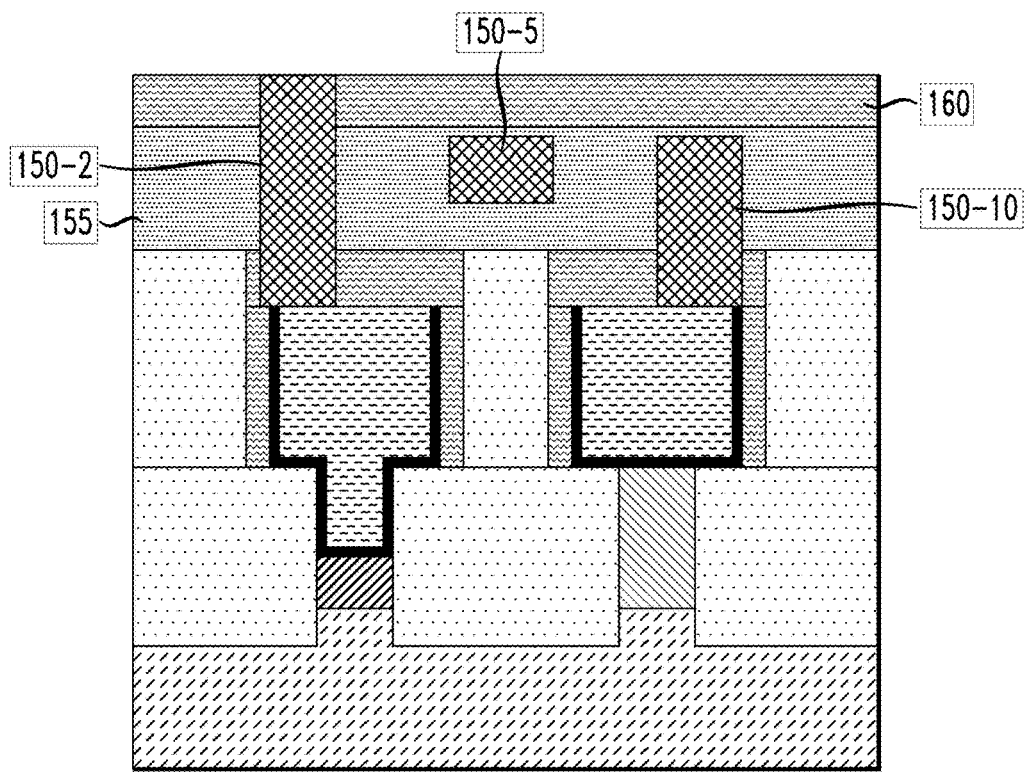
FIG. 4B is a cross-sectional view illustrating metallization in a method of manufacturing a semiconductor device, according to an exemplary embodiment of the present invention.

FIGS. 4A and 4B are cross-sectional views illustrating source/drain contact formation and metallization in a method of manufacturing a semiconductor device, according to an exemplary embodiment of the present invention. The cross-sectional views in FIGS. 4A and 4B are taken along lines of a top view (not shown) corresponding to FIGS. 4A and 4B, and corresponding in location to the lines C and B, respectively, of FIG. 2D.

Figure 5A:
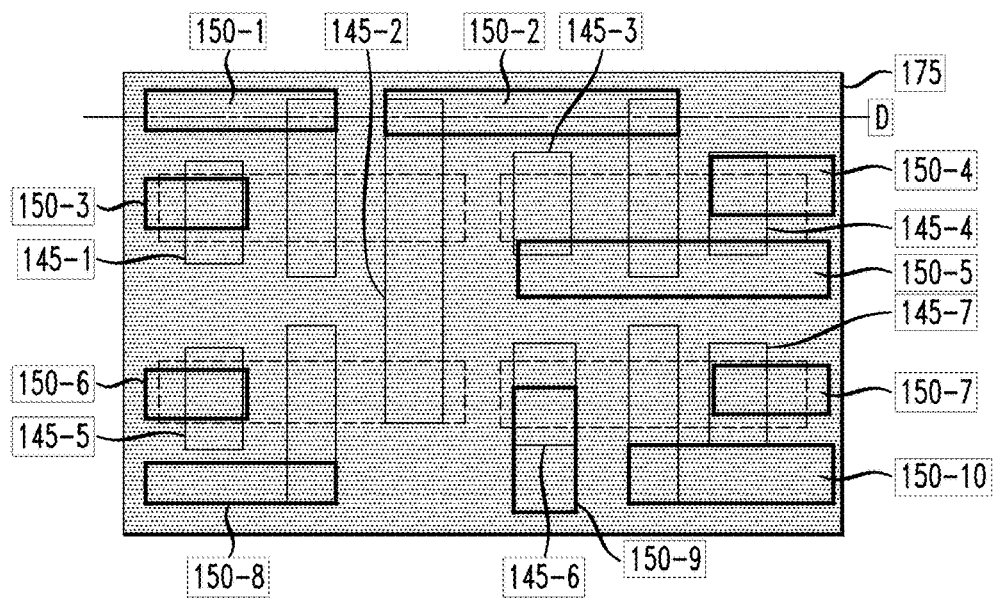
FIG. 5A is a top down view illustrating sacrificial layer deposition in a method of manufacturing a semiconductor device, according to an exemplary embodiment of the present invention.

Referring to FIGS. 4A and 4B, trenches are opened in the dielectric layer 114 over the source/drain regions 116 and 118 using, for example, lithography followed by ME, to expose the source/drain regions 116 and 118. Contacts to source/drain regions 116 and 118 are formed in the trenches by filling the trenches with contact material layers 145-1, 145-2, 145-3 and 145-4. Referring to FIG. 5A discussed further herein below, additional source/drain contact layers 145-5, 145-6 and 145-7 can also be formed to contact source/drain regions 118 of the NFET transistors. The contact material layers 145-1, 145-2, 145-3, 145-4, 145-5, 145-6 and 145-7 include, for example, electrically conductive material including, but not necessarily limited to, tungsten, cobalt, zirconium, tantalum, titanium, aluminum, ruthenium, and/or copper. A liner layer including, for example, titanium and/or titanium nitride, may be formed on side and bottom surfaces of the trench and on the source/drain regions 116 and 118 before filling the trench with the contact material layers 145-1, 145-2, 145-3, 145-4, 145-5, 145-6 and 145-7.

Deposition of the contact material layers 145-1, 145-2, 145-3, 145-4, 145-5, 145-6 and 145-7 can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

Referring to FIGS. 4A and 4B (and to FIGS. 5A and 5B discussed further herein below), metallization, for example, back-end-of-line (BEOL) metallization is performed to form metal interconnects 150-1, 150-2, 150-3, 150-4, 150-5, 150-6, 150-7, 150-8, 150-9 and 150-10 to source/drain contacts and to gate metal layers 130. The number of interconnects and their patterns can vary based on design constraints. The metal interconnects 150-1, 150-2, 150-3, 150-4, 150-5, 150-6, 150-7, 150-8, 150-9 and 150-10 include, for example, electrically conductive material including, but not necessarily limited to, tungsten, cobalt, zirconium, tantalum, titanium, aluminum, ruthenium, and/or copper, and can be deposited using one or more of the deposition techniques noted herein.

Dielectric layers 155 and 160 are disposed on and around the metal interconnects 150-1, 150-2, 150-3, 150-4, 150-5, 150-6, 150-7, 150-8, 150-9 and 150-10. The dielectric layer 155 includes, for example, phosphosilicate glass (PSG), borosilicate glass (BSG), tetraethyl orthosilicate (TEOS), an oxide or other similar dielectric, and the dielectric layer 160 includes, for example, a nitride, such as but not necessarily limited to, SiBN, SiBCN, SiOCN or SiN. The dielectric layer 160 is planarized using, for example, CMP.

Figure 5B:
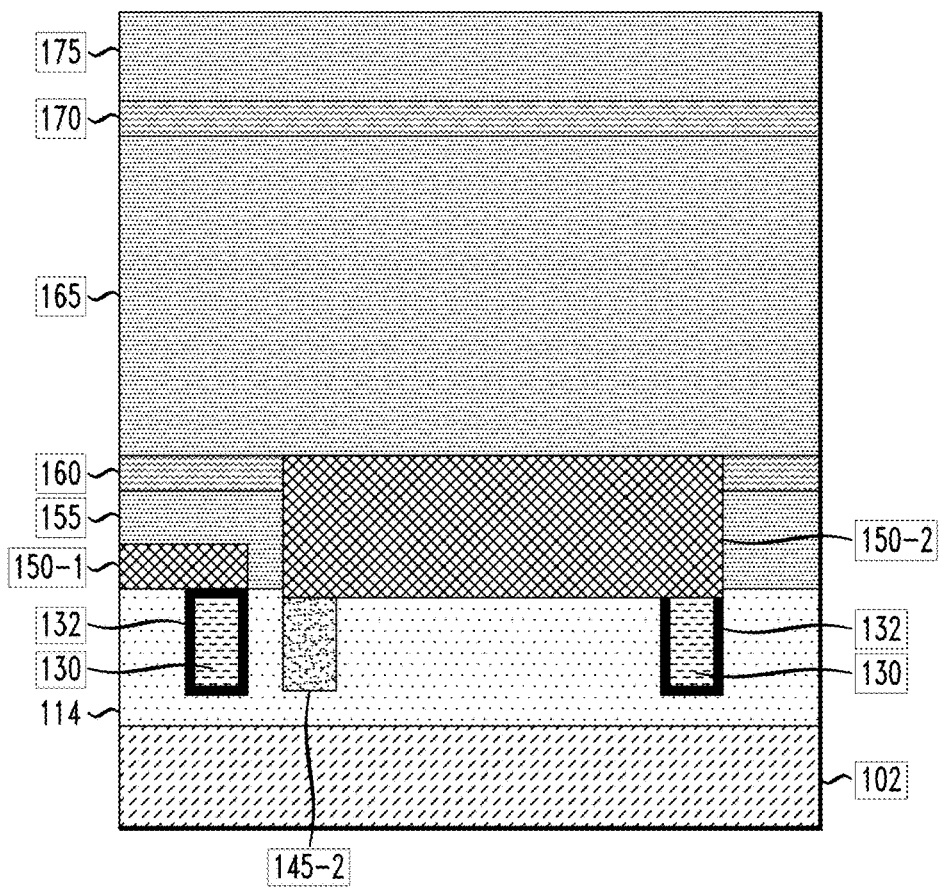
FIG. 5B is a cross-sectional view taken along the line D in FIG. 5A illustrating sacrificial layer deposition in a method of manufacturing a semiconductor device, according to an exemplary embodiment of the present invention.

FIG. 5A is a top down view and FIG. 5B is a cross-sectional view taken along the line D in FIG. 5A illustrating sacrificial layer deposition in a method of manufacturing a semiconductor device, according to an exemplary embodiment of the present invention. Referring to FIGS. 5A-5B, sacrificial layers 165, 170 and 175 are deposited on the dielectric layer 160 and on interconnect 150-2 using, for example, one or more deposition techniques, including, but not necessarily limited to, CVD, PECVD, PVD, ALD, MBD, PLD, LSMCD, and/or spin-on coating, followed by planarization using a planarization process, such as, for example, CMP. The sacrificial layers 165 and 175 include, for example, PSG, borosilicate glass BSG, TEOS, an oxide or other similar dielectric, and the sacrificial layer 170 includes, for example, a nitride, such as but not necessarily limited to, SiBN, SiBCN, SiOCN or SiN. In accordance with an embodiment of the present invention, the sacrificial layer 170 has an etch selectivity with respect to the sacrificial layers 165 and 175, and the sacrificial layers 165 and 175 have an etch selectivity with respect to the sacrificial layer 170. A combined thickness of the sacrificial layers 165, 170 and 175 is in the range of about 0.5 μm to about 5 μm.

FIGS. 5B, 6-11 and 12B show a simplified diagram of device components under the dielectric layer 155, where some elements have been omitted from the diagram for simplicity. In general, FIGS. 5B, 6-11 and 12B illustrate the PFET transistors corresponding to transistor well regions 106 and interconnects 150-1 and 150-2 connected thereto. The cross-sectional views in FIGS. 6-11 are taken along lines of top views (not shown) corresponding to FIGS. 6-11, respectively and corresponding in location to the line D of FIG. 5A.

Figure 6:
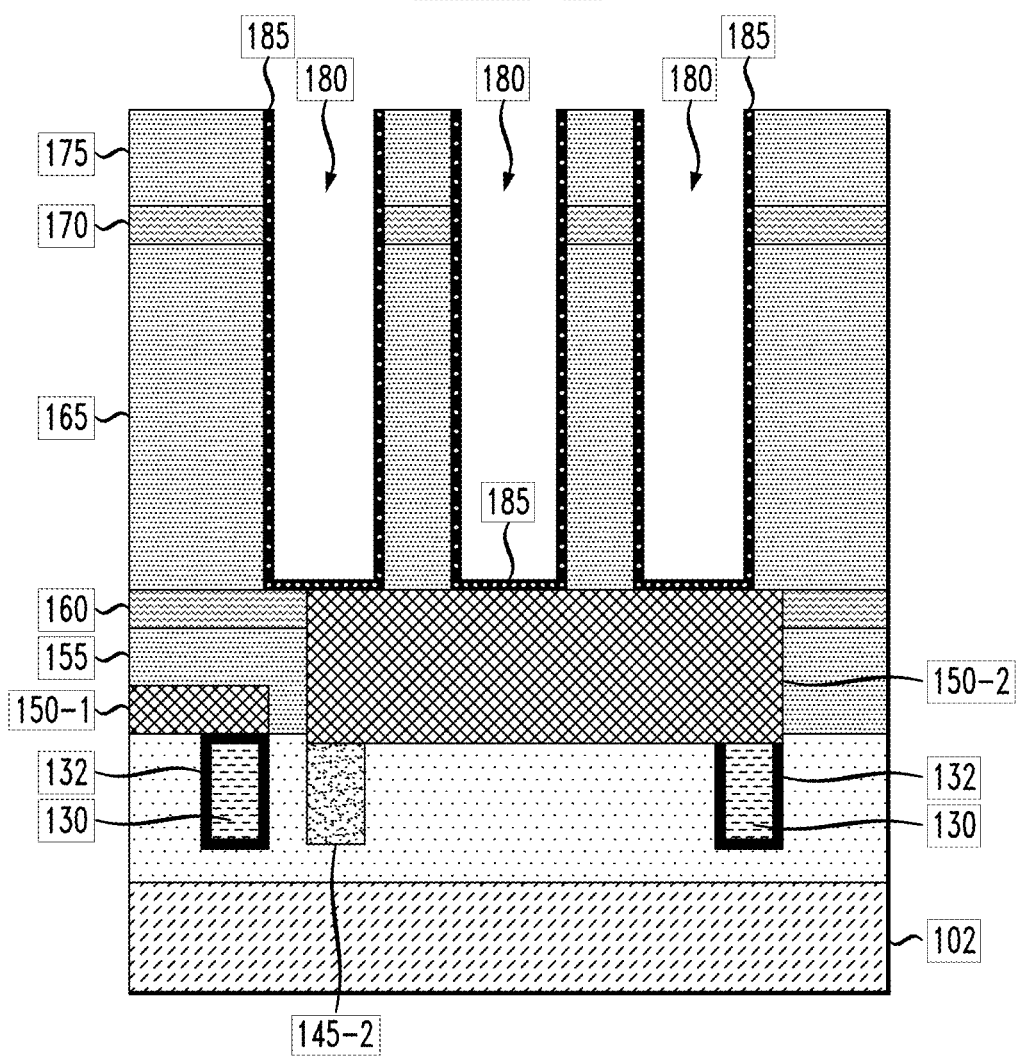
FIG. 6 is a cross-sectional view illustrating capacitor bottom electrode formation in a method of manufacturing a semiconductor device, according to an exemplary embodiment of the present invention.

FIG. 6 is a cross-sectional view illustrating stacked capacitor hole and capacitor bottom electrode formation in a method of manufacturing a semiconductor device, according to an exemplary embodiment of the present invention. Referring to FIG. 6, a plurality of openings 180 are formed through the sacrificial layers 165, 170 and 175 where stacked capacitors are going to be formed. The plurality of openings (or holes) 180 are formed through the sacrificial layers 165, 170 and 175 exposing portions of the interconnect 150-2 and portions of dielectric layer 160. The openings 180 can be formed using, for example, fluorine based ME. Although three openings 180 are shown, the embodiments of the present invention are not necessarily limited thereto, and more or less than three openings 180 for stacked capacitors can be formed.

Capacitor bottom electrodes 185 are deposited in the openings 180, and line bottom and lateral sides of the openings 180. In accordance with an embodiment of the present invention, the capacitor bottom electrodes 185 include, but are not necessarily limited to, hemispherical grained (HSG) doped silicon, with a thickness from about 5 nm to about 50 nm. The bottom electrodes 185 are deposited using, for example, one or more deposition techniques, including, but not necessarily limited to CVD.

Figure 7:
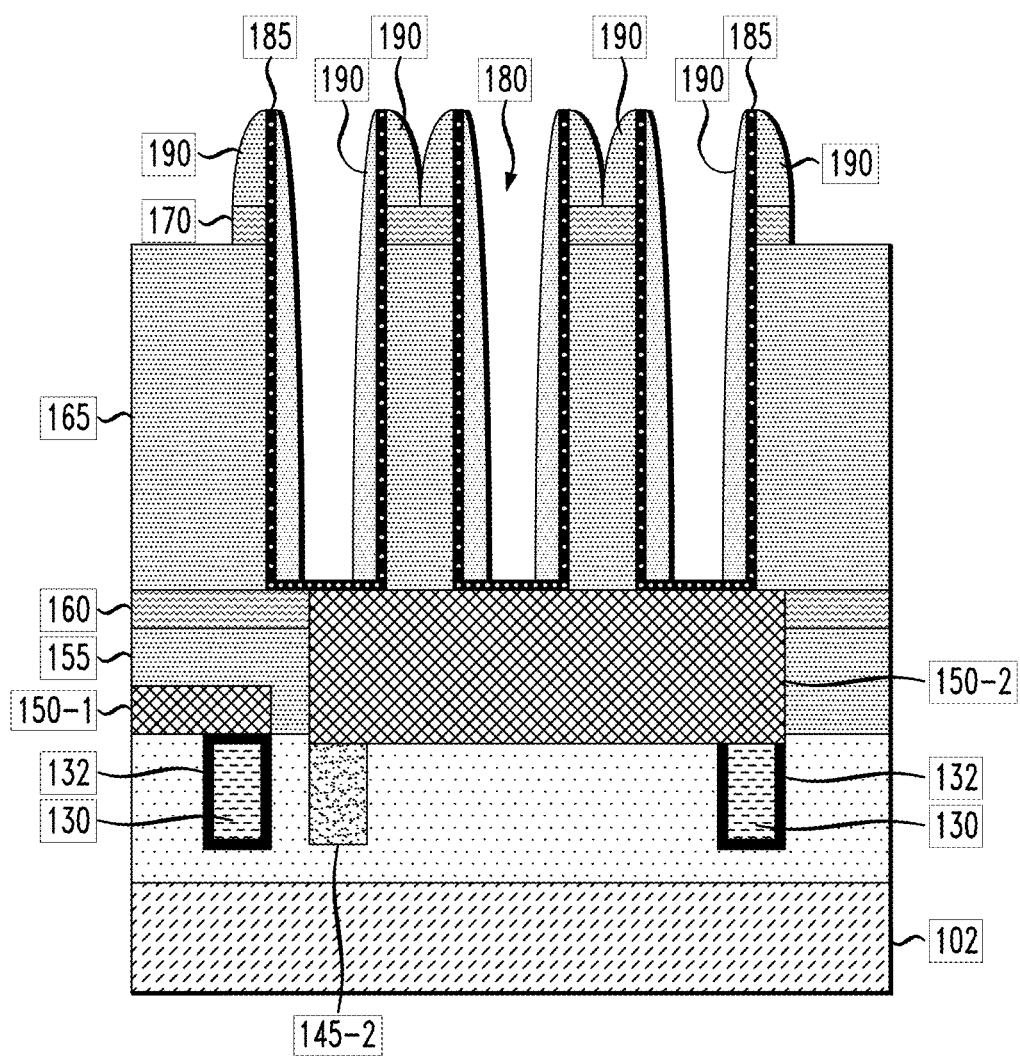
FIG. 7 is a cross-sectional view illustrating dielectric spacer formation in a method of manufacturing a semiconductor device, according to an exemplary embodiment of the present invention.

FIG. 7 is a cross-sectional view illustrating top sacrificial layer removal and dielectric spacer formation in a method of manufacturing a semiconductor device, according to an exemplary embodiment of the present invention. Referring to FIG. 7, the top sacrificial layer 175 is selectively removed with respect to the bottom electrodes 185 down to the middle sacrificial layer 170. The selective removal of the top sacrificial layer is performed using, for example, fluorine based RIE.

Then, dielectric spacers 190 are formed on exposed sides of the bottom electrode 185 in and out of the openings 180. The dielectric spacers 190 formed on exposed sides of the bottom electrode outside of the openings 180 are formed on and cover portions of the middle sacrificial layer 170. The dielectric spacers 190 are deposited using, for example, one or more deposition techniques, including, but not necessarily limited to, CVD. Then, exposed portions of the middle sacrificial layer 170 (i.e., not covered by the spacers 190) are selectively removed with respect to the dielectric spacers 190, using, for example, fluorine based RIE. The dielectric spacers 190 include the same or similar material as that of the bottom sacrificial layer 165.

Figure 8:
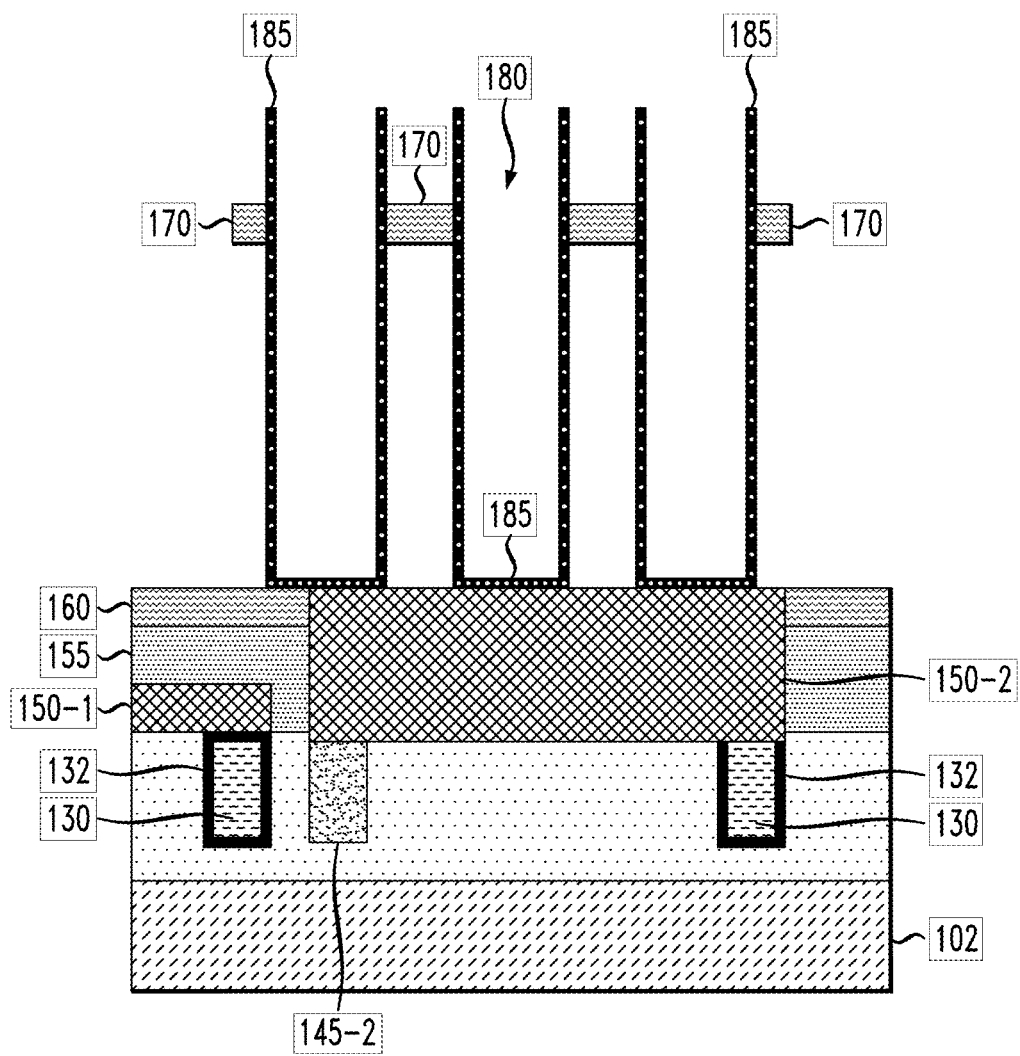
FIG. 8 is a cross-sectional view illustrating sacrificial layer removal in a method of manufacturing a semiconductor device, according to an exemplary embodiment of the present invention.

FIG. 8 is a cross-sectional view illustrating sacrificial layer removal in a method of manufacturing a semiconductor device, according to an exemplary embodiment of the present invention. Referring to FIG. 8, the dielectric spacers 190 and the bottom sacrificial layer 165 are selectively removed with respect to the remaining portions of the middle sacrificial layer 170 and the bottom capacitor electrode 185. The remaining portions of the middle sacrificial layer 170 provide mechanical stability for the bottom capacitor electrodes 185 by bracing the sides of the bottom capacitor electrodes 185 as shown in FIG. 8. The dielectric spacers 190 and the bottom sacrificial layer 165 are selectively removed using, for example, HF wet etch.

Figure 9:
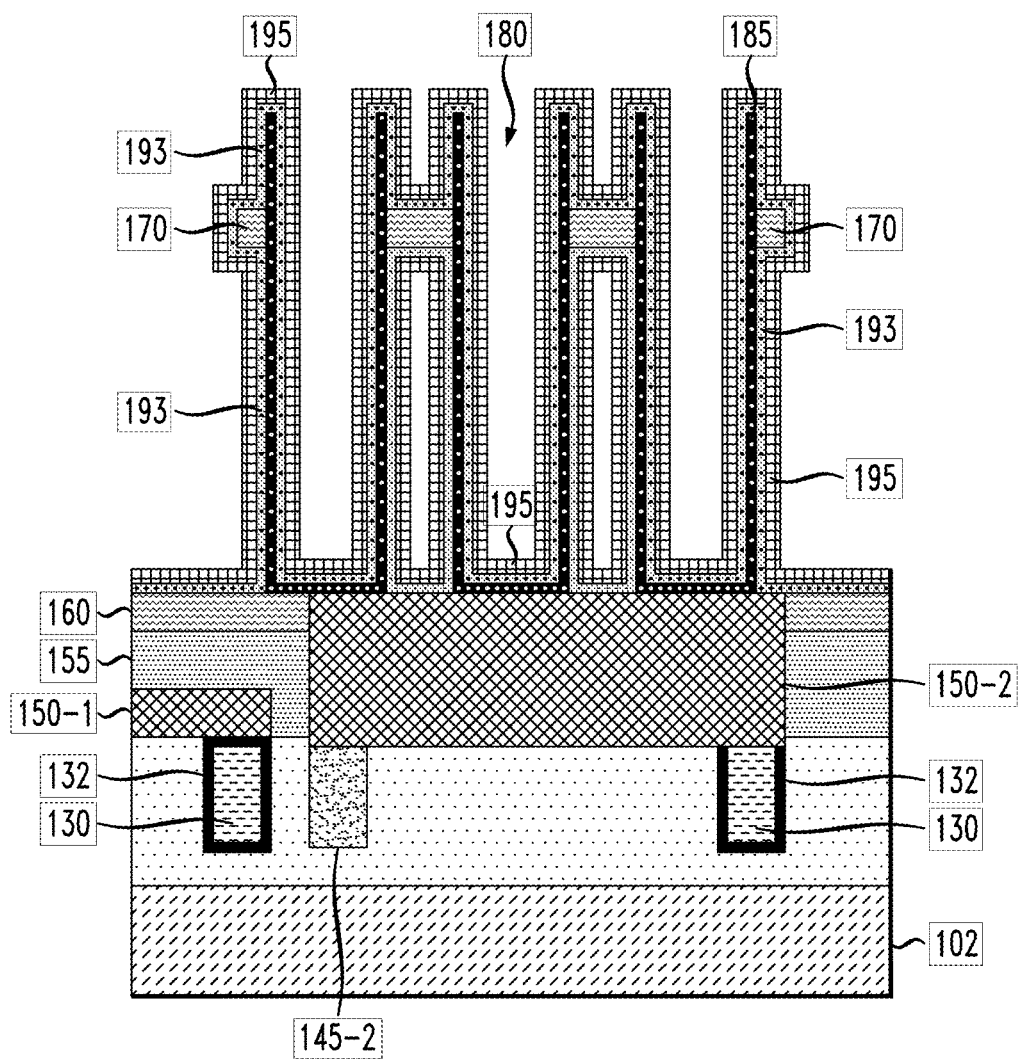
FIG. 9 is a cross-sectional view illustrating capacitor dielectric and top electrode formation in a method of manufacturing a semiconductor device, according to an exemplary embodiment of the present invention.

FIG. 9 is a cross-sectional view illustrating capacitor dielectric and top electrode formation in a method of manufacturing a semiconductor device, according to an exemplary embodiment of the present invention. Referring to FIG. 9, capacitor dielectric layers 193 are conformally deposited on the bottom electrodes 185 in and outside of the openings 180, and on the exposed portions of the remaining middle sacrificial layer 170, dielectric layer 160 and interconnect 150-2. The capacitor dielectric layers 193 include, for example, a high-k material, such as, but not necessarily limited to, $HfO_x$, $ZrO_2$, hafnium zirconium oxide, $Al_2O_3$, and $Ta_2O_5$ or other high-k dielectric material described herein. Top capacitor electrode layers 195 are conformally deposited on the capacitor dielectric layers 193. The top capacitor electrode layers 195 include, but are not necessarily limited to, TiN, TaN, W, etc. with a thickness from about 5 nm to about 50 nm. The dielectric layers 193 and the top electrode layers 195 are deposited using, for example, one or more conformal deposition techniques, including, but not necessarily limited to CVD or ALD.

Figure 10:
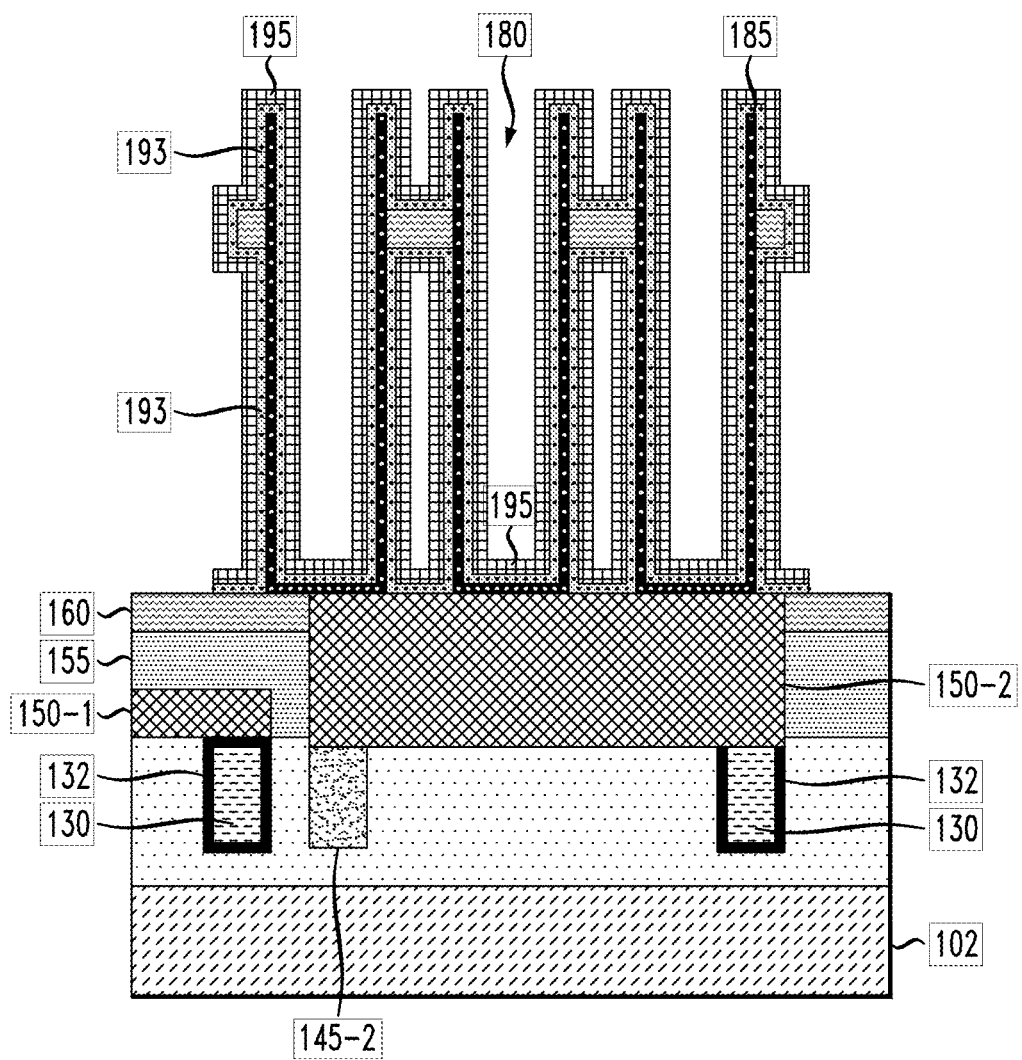
FIG. 10 is a cross-sectional view illustrating capacitor top electrode and underlying dielectric patterning in a method of manufacturing a semiconductor device, according to an exemplary embodiment of the present invention.

FIG. 10 is a cross-sectional view illustrating capacitor top electrode and underlying dielectric patterning in a method of manufacturing a semiconductor device, according to an exemplary embodiment of the present invention. Referring to FIG. 10, portions of the top capacitor electrode 195 and portions of the capacitor dielectric 193 under the portions of the top capacitor electrode 195 are removed from regions where the top capacitor electrode and dielectric 195, 193 are not needed. The removal of these portions of the top capacitor electrode and dielectric 195, 193 exposes portions of the dielectric layer 160 as shown in FIG. 10. The removal is performed using, for example, an etch process, and one or more masks to block removal of the remaining portions of the top capacitor electrode and dielectric 195, 193.

Figure 11:
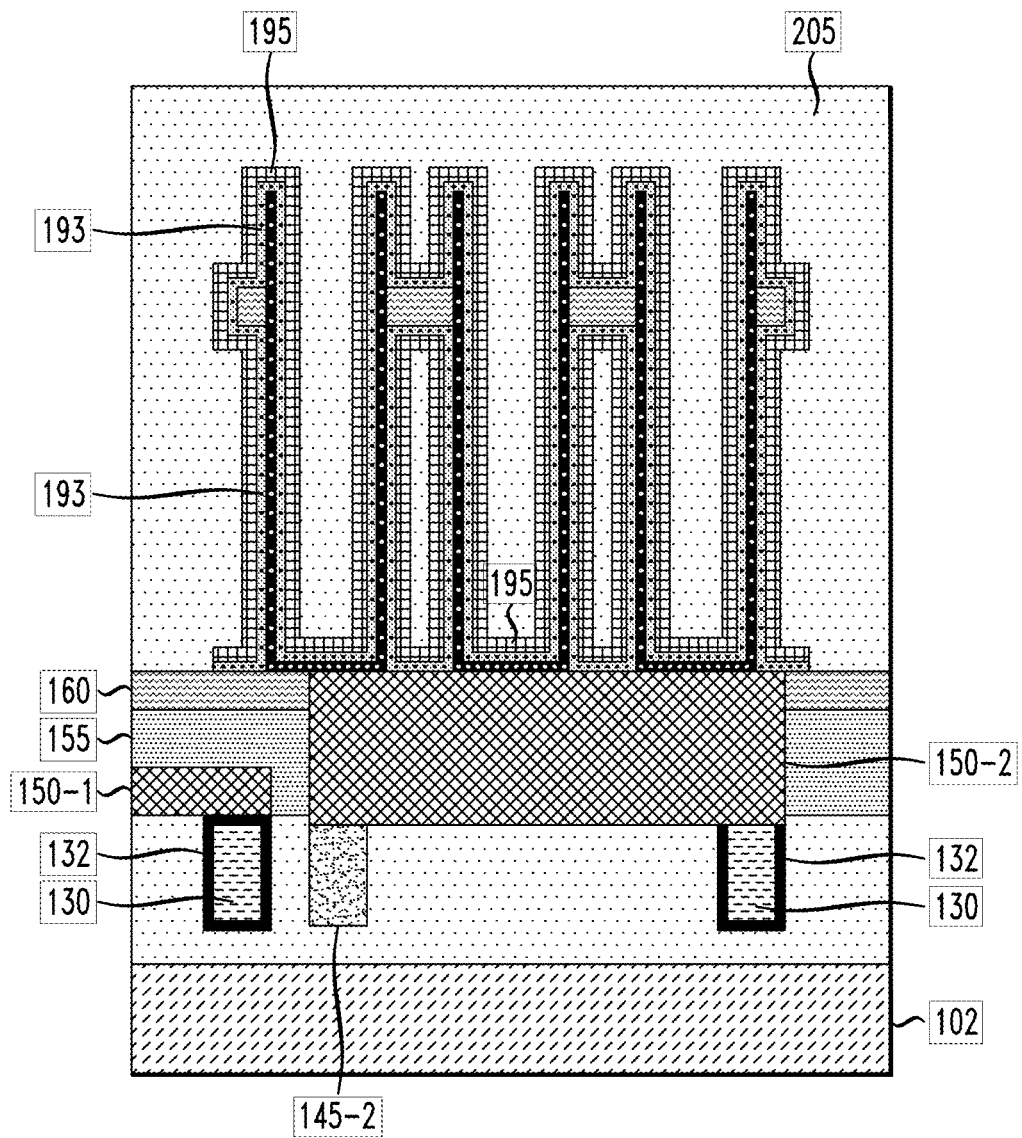
FIG. 11 is a cross-sectional view illustrating dielectric layer deposition and planarization in a method of manufacturing a semiconductor device, according to an exemplary embodiment of the present invention.

FIG. 11 is a cross-sectional view illustrating dielectric layer deposition and planarization in a method of manufacturing a semiconductor device, according to an exemplary embodiment of the present invention. Referring to FIG. 11, a dielectric layer 205 is deposited on the structure from FIG. 10, including on the exposed portions of the dielectric layer 160, and on and around the stacked capacitors having the bottom and top electrodes 185 and 195, and the dielectric layer 193 between the bottom and top electrodes 185 and 195. The dielectric layer 205 includes the same or similar materials as the dielectric layers 104 and 114, can be deposited using, for example, deposition techniques including, but not limited to, CVD, PECVD, RFCVD, PVD, ALD, MLD, MBD, PLD, LSMCD, and/or sputtering. Following deposition of the dielectric layer 205, excess portions of the dielectric layer 205 are removed by a planarization process, such as, for example, CMP.

Figure 12A:
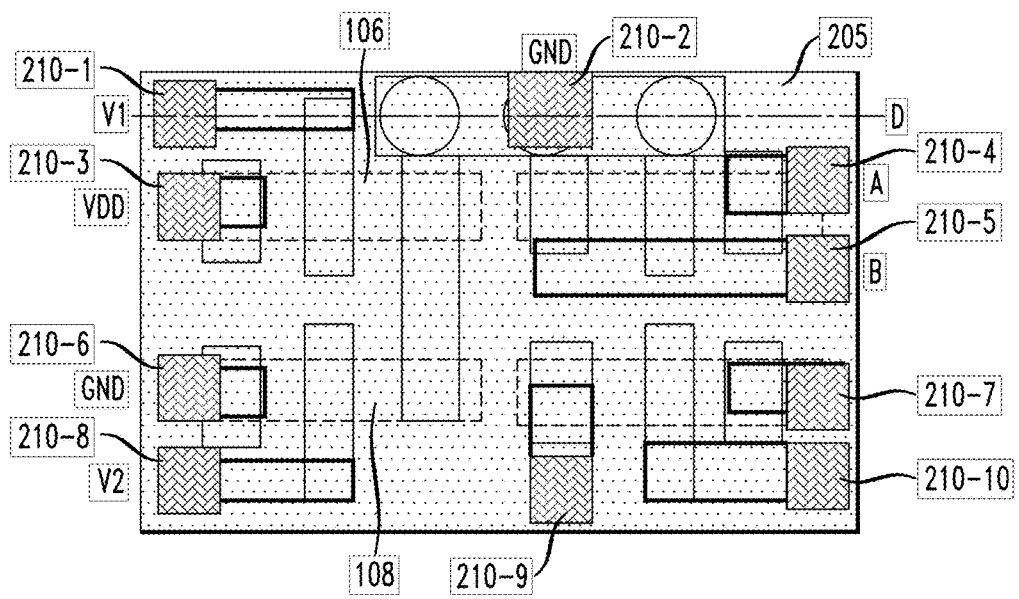
FIG. 12A is a top down view illustrating contact formation in a method of manufacturing a semiconductor device, according to an exemplary embodiment of the present invention.
Figure 12B:
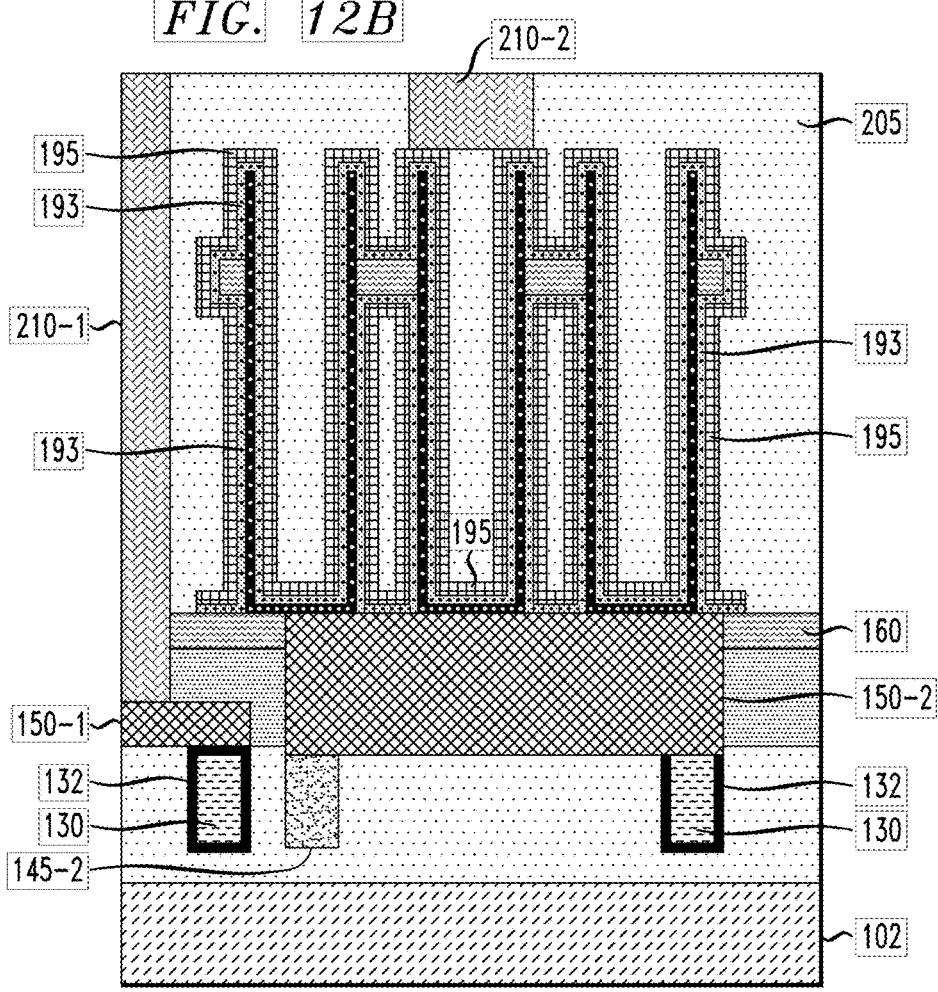
FIG. 12B is a cross-sectional view taken along the line D in FIG. 12A illustrating contact formation in a method of manufacturing a semiconductor device, according to an exemplary embodiment of the present invention.

FIG. 12A is a top down view and FIG. 12B is a cross-sectional view taken along the line D in FIG. 12A illustrating contact formation in a method of manufacturing a semiconductor device, according to an exemplary embodiment of the present invention. Referring to FIGS. 12A-12B, contact holes are patterned in the dielectric layer 205 and filled with contact material to form contacts 210-1, 210-2, 210-3, 210-4, 210-5, 210-6, 210-7, 210-8, 210-9 and 210-10 to interconnects, capacitors, source/drain regions, and transistor gates. For example, the contacts shown in FIGS. 12A and 12B correspond to the circuit diagram in FIG. 1A, and carry gate voltages $V_1$ and $V_2$ and supply voltage $V_{dd}$ for transistors 12 and 14 providing current sources for charging and discharging, provide connections to ground (GND) for the transistor 14 and the capacitor 18, and source/drain outputs A and B of the readout transistor 16. Referring to FIG. 12B, the contact 210-1 extends to the interconnect 150-1 and to the gate metal 130 of the first PFET transistor on the upper left in FIG. 12A, and the contact 210-2 is connected to a capacitor 18 connected in parallel to the transistors 12, 14 and 16. The number of contacts and their patterns can vary based on design constraints. The contacts 210-1, 210-2, 210-3, 210-4, 210-5, 210-6, 210-7, 210-8, 210-9 and 210-10 include, for example, electrically conductive material including, but not necessarily limited to, tungsten, cobalt, zirconium, tantalum, titanium, aluminum, ruthenium, and/or copper, and can be deposited using one or more of the deposition techniques noted herein.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

I claim:

1. A method for manufacturing a semiconductor device, comprising:
   forming a plurality of transistors on a semiconductor substrate, wherein forming the plurality of transistors comprises recessing channels of at least two transistors of the plurality of transistors;
   forming a stacked capacitor on the semiconductor substrate;
   wherein forming the stacked capacitor on the semiconductor substrate comprises:
      forming a plurality of sacrificial layers on the semiconductor substrate;
      forming an opening through the plurality of sacrificial layers; and
      depositing a bottom capacitor electrode on bottom and lateral sides of the opening;
   wherein forming the plurality of sacrificial layers comprises:
      forming a second sacrificial layer on a first sacrificial layer; and
      forming a third sacrificial layer on the second sacrificial layer;
   wherein the first and third sacrificial layers are formed of a material which can be selectively etched with respect to the second sacrificial layer;
   wherein forming the stacked capacitor on the semiconductor substrate further comprises:
      selectively removing the third sacrificial layer with respect to the bottom capacitor electrode and the second sacrificial layer;
      forming a dielectric spacer layer on side portions of the bottom capacitor electrode, and on portions of the second sacrificial layer;
      removing exposed portions of the second sacrificial layer; and
      selectively removing the dielectric spacer layer from the side portions of the bottom capacitor electrode, and from the portions of the second sacrificial layer remaining after the removal of the exposed portions of the second sacrificial layer; and
   electrically connecting the stacked capacitor in parallel to the at least two transistors of the plurality of transistors comprising the recessed channels and to an additional one of the plurality of transistors;
   wherein the stacked capacitor, the at least two transistors and the additional one of the plurality of transistors form a memory cell of a plurality of memory cells of a memory device.

2. The method according to claim 1, wherein the at least two transistors of the plurality of transistors respectively provide current sources for charging and discharging the memory cell.

3. The method according to claim 2, wherein the additional one of the plurality of transistors comprises a read out transistor.

4. The method according to claim 3, wherein the additional one of the plurality of transistors is without a recessed channel.

5. The method according to claim 3, wherein the additional one of the plurality of transistors comprises a shorter gate length than the gate lengths of the at least two transistors of the plurality of transistors.

6. The method according to claim 1, wherein the at least two transistors and the additional one of the plurality of transistors comprise at least one p-type field effect transistor (PFET) and at least one n-type field effect transistor (NFET).

7. The method according to claim 1, further comprising forming the plurality of memory cells in a crossbar array.

8. The method according to claim 1, wherein the recessing of the channels of the at least two transistors of the plurality of transistors comprises removing a portion of a channel region between source/drain regions for each of the at least two transistors.

9. The method according to claim 8, further comprising replacing the removed portion of the channel region with a gate structure in each of the at least two transistors.

10. The method according to claim 1, wherein forming the stacked capacitor on the semiconductor substrate further comprises selectively removing the first sacrificial layer with respect to the remaining portions of the second sacrificial layer.

11. The method according to claim 10, wherein forming the stacked capacitor on the semiconductor substrate further comprises conformally depositing a top capacitor electrode and a capacitor dielectric layer on the bottom capacitor electrode and the remaining portions of the second sacrificial layer.

* * * * *